United States Patent [19]

Mashiko

[11] Patent Number: 4,912,678

[45] Date of Patent: Mar. 27, 1990

[54] DYNAMIC RANDOM ACCESS MEMORY DEVICE WITH STAGGERED REFRESH

[75] Inventor: Koichiro Mashiko, Hyogo, Japan

[73] Assignee: Mitsubishi Denki Kabushiki Kaisha, Tokyo, Japan

[21] Appl. No.: 247,286

[22] Filed: Sep. 22, 1988

[30] Foreign Application Priority Data

Sep. 26, 1987 [JP] Japan .......................... 62-241056

[51] Int. Cl.$^4$ .......................... G11C 7/00; G11C 8/00
[52] U.S. Cl. .............................. 365/222; 365/230.06; 365/227
[58] Field of Search ................ 365/222, 205, 206, 207, 365/208, 233, 230.03

[56] References Cited

U.S. PATENT DOCUMENTS 4,725,987  2/1988  Cates ................................ 365/222 X
4,787,067 11/1988  Takemae et al. ................... 365/222
4,829,484  5/1989  Arimoto et al. .................... 365/222

Primary Examiner—Stuart N. Hecker
Assistant Examiner—Alyssa H. Bowler
Attorney, Agent, or Firm—Lowe, Price, LeBlanc, Becker & Shur

[57] ABSTRACT

A dynamic random access memory (DRAM) comprises a divided plurality of memory array blocks. Each memory array block comprises a memory array having memory cells and a sense amplifier. In refresh operation, activating signals for activating each of the sense amplifiers are outputted. The output timings of the activating signals are different from each other, so that each of the sense amplifiers are activated at different timings. Consequently, a peak value of the current consumed by the activation of the sense amplifiers can be reduced.

9 Claims, 5 Drawing Sheets

FIG. 6(A) PRIOR ART
FIG. 6(B) PRIOR ART
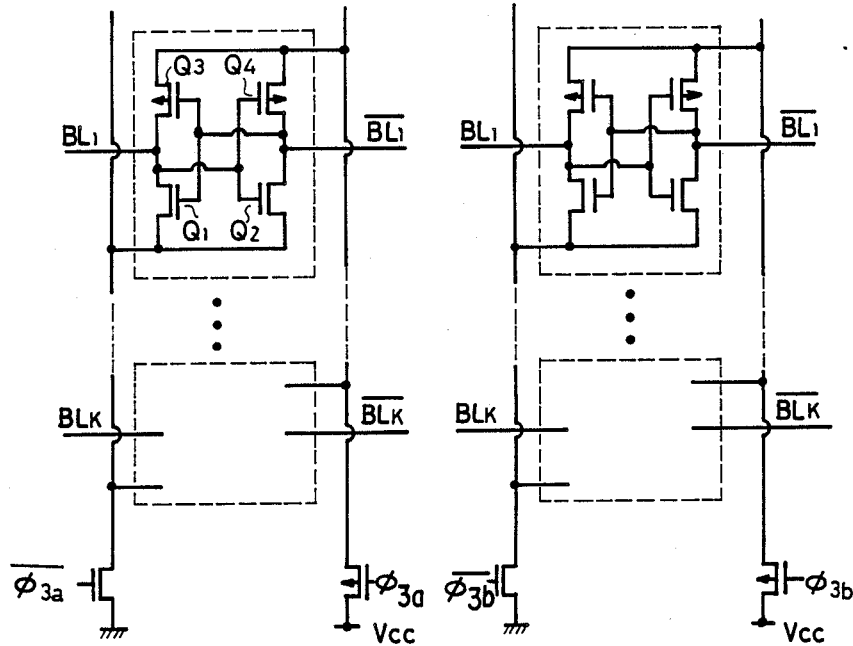
FIG. 7 PRIOR ART
FIG. 10
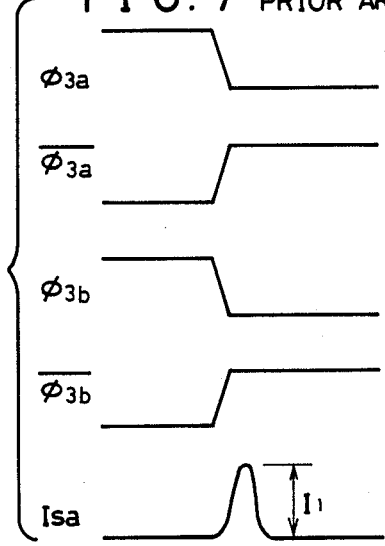
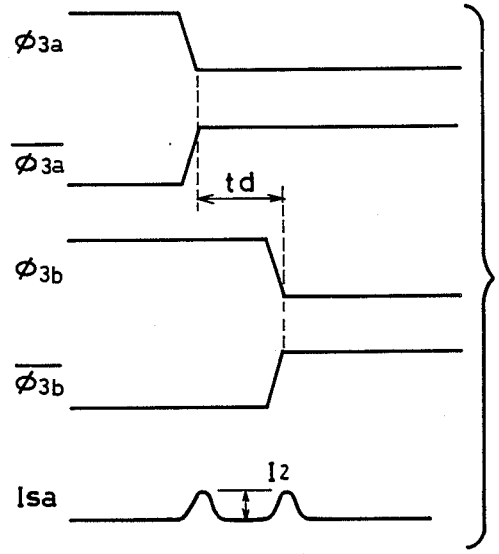

DYNAMIC RANDOM ACCESS MEMORY DEVICE WITH STAGGERED REFRESH

BACKGROUND OF THE INVENTION

1. Field of the Invention

The present invention generally relates to dynamic random access memory devices and, more specifically, to a dynamic random access memory device (hereinafter simply referred to as DRAM) in which a peak value of current consumed in refresh operation is reduces.

2. Description of the Prior Art

FIG. 1 is a block diagram showing one example of a conventional DRAM. The DRAM shown in this figure is disclosed in, for example, Japanese Patent Publication Gazette No. 23397/1987. Referring to FIG. 1, the DRAM comprises divided two memory array blocks 100a and 100b. The memory array block 100a comprises memory cell arrays (MCA) 31a and 32a connected to a sense amplifer (SA) 41a, Y decoders (YD) 21a and 22a, and dummy cell columns (DCC) 51a and 52a. Similarly, the memory array block 100b comprises memory cell arrays 31b and 32b connected to a sense amplifier 41b, Y decoders 21b and 22b, and dummy cell columns 51b and 52b. An address buffer (AB) 80 for receiving external address signals Ao to An, from which X address signals Xo to Xn and Y address signals Yo to Yn are outputted. Four X decoders (XD) 11a, 12a, 11b and 12b, each connected to receive signals Xo to Xn, are connected to memory cell arrays 31a, 32a, 31b and 32b through word lines WL1a to WL2ma and WL1b to WL2mb, respectively. An input/output control circuit (IOC) 90 is connected to four memory cell arrays 31a to 32b through four I/O lines 93 to 96 so as to control input/output of data signals through a data input buffer (DIB) 91 and a data output buffer (DOB) 92 connected thereto.

There is a sense amplifier activating signal generating circuit (SAG) 70 generating an activating signal $\phi 3$ for activating two sense amplifiers with a sense amplifier decoder (SAD) 61 connected to the output thereof. The signal $\phi 3$ is outputted in response to an external $\overline{RAS}$ signal. The sense amplifier decoder 61 receives the signal $\phi 3$ and outputs signals $\phi 3a$ and $\phi 3b$ for selectively activating either one or both of the two sense amplifiers 41a and 41b in response to the X address signal Xn. The sense amplifiers 41a and 41b are activated in response to the signals $\phi 3a$ and $\phi 3b$, respectively. The signal Xn is a signal of the most significant bit and generally used for a largest division of the memory cell array.

A refresh control circuit 71 is connected to receive an external $\overline{RAS}$ signal and an external $\overline{CAS}$ signal. It detects the fall of the $\overline{CAS}$ signal before the fall of the $\overline{RAS}$ signal so as to determine that the refresh mode is externally designated. In a DRAM having self refresh mode, the circuit 71 detects a $\overline{REF}$ signal for designating the self refresh mode. In either case, when the refresh operation is requested, a delayed signal $\phi 4$ is outputted to the sense amplifier decoder 61 in response to the detection.

In reading operation, the sense amplifier decoder 61 outputs either the signal $\phi 3a$ or $\phi 3b$ for activating one of the two sense amplifiers 41a and 41b in response to the X address signal Xn. A data signal stored in the memory cell is amplified by the activated sense amplifier 41a or 41b to be outputted through one of the I/O lines 93 to 96 and through the data output buffer 92.

In refresh operation, the sense amplifier decoder 61 outputs the signals $\phi 3a$ and $\phi 3b$ simultaneously for activating both sense amplifiers 41a and 41b. The data signals stored in the memory cells are amplified by the activated sense amplifiers 41a and 41b to be stored again in the memory cells. Such refresh operation is effected on the memory cells respectively connected to the word lines WL1a to WL2mb. More specifically, m word lines are successively selected by the X decoders 11a to 12b and the sense amplifiers 41a and 41b are activated every time to refresh the data signals in the memory cells connected to the word line.

FIG. 2 is a schematic diagram showing a part of the memory cell array 31a and the sense amplifier 41a connected through a bit line pair BLj and $\overline{BLj}$. FIG. 3 is a timing chart illustrating the operation thereof. These are shown in, for example, Digest of Technical Papers pp. 252 and 253 of International Solid-State Circuits Conference 85 held in 1985.

Referring to FIG. 2, a memory cell M is connected between a bit line BLj and a word line WLi. The memory cell M comprises a capacitor Cs for storing a data signal and an NMOS transistor Qs for switching. The sense amplifier 31a comprises a CMOS flip flop connected between the bit lines BLj and $\overline{BLj}$. The CMOS flip flop is constituted by PMOS transistors Q3 and Q4 and NMOS transistors Q1 and Q2. The flip flop is connected to a power supply Vcc and to the ground Vss through a PMOS transistor $Q_{SP}$ and through an NMOS transistor $Q_{SN}$, respectively. The transistors $Q_{SP}$ and $Q_{SN}$ have their gates connected to receive activating signals $\phi 3a$ and $\phi 3a$, respectively. An equalizing circuit comprises an NMOS transistor Q5 and a series connection of NMOS transistors Q6 and Q7 connected between the bit lines BLj and $\overline{BLj}$. The gates of these transistors are connected to receive an equalizing signal EQ. An I/O gate comprises an NMOS transistor Q8 connected between the bit line BLj and an I/O line and an NMOS transistor Q9 connected between the bit line $\overline{BLj}$ and an I/O line. The transistors Q8 and Q9 have their gates connected to receive a signal Yj from a column decoder 21a.

In reading operation, first, the transistors Q5, Q6 and Q7 are turned on in response to a high level equalizing signal EQ and the bit line pair BLj and $\overline{BLj}$ are brought to a precharge voltage $V_{BL}$ ($\frac{1}{2}$ Vcc). Meanwhile, the sense amplifier power supply line $L_P$ and a sense amplifier ground line $L_N$ are also brought to $V_{BL}$. After the fall of the external $\overline{RAS}$ signal, the signal EQ changes to low level. Thereafter, the word line signal WLi becomes high level and the switching transistor Qs of the memory cell M turns on. The voltage of the bit line BLj slightly changes upon reception of a signal from the memory cell M. Consequently, a slight voltage difference is generated between the bit line $\overline{BLj}$ having the voltage of $V_{BL}$ and the bit line BLj.

On this occasion, the signals $\phi 3a$ and $\phi 3a$ are changed to activate the sense amplifier 41a. The change of the signal $\phi 3a$ is a little delayed from the change of the signal $\phi 3a$. As a result, the slight voltage difference generated between the bit lines is amplified by the sense amplifier 41a. Thereafter, a high level signal Yj is applied to the gates of the transistors Q8 and Q9 from the Y decoder 21a and the amplified data signal is applied to the I/O line pair through the transistors Q8 and Q9.

In the refresh operation, different from the above operation, the amplified data signal is not applied to the I/O line pair but only to the capacitor Cs of the memory cell.

FIGS. 4 and 5 are schematic diagrams showing conventional sense amplifier decoders 61 and 62, respectively. These figures are also shown in the above mentioned Japanese Patent Publication Gazette No. 23397/1987. Referring to FIG. 4, the sense amplifier 61 comprises a first parallel connection of NMOS transistors T9 and T10 and a second parallel connection of NMOS transistors T11 and T12 connected to receive an activating signal $\phi 3$ outputted from a sense amplifier activating signal generating circuit (SAG) 70 and an NMOS transistor T13 connected between output lines 3a and 3b. The transistor T9 has its gate connected to receive the above described X address signal Xn and the transistor T12 has its gate connected to receive the inverted signal $\overline{Xn}$. The transistors T10, T11 and T13 have their gates connected together to receive a refresh control signal $\phi 4$. The signal $\phi 4$ is outputted from the refresh control circuit in the DRAM in response to an externally applied signal instructing the refresh operation. The decoded activating signals $\phi 3a$ and $\phi 3b$ are outputted from the sense amplifier decoder 61.

In the normal reading operation except the refresh operation, a low level refresh control signal $\phi 4$ is applied to turn off the transistors T10, T11 and T13. Meanwhile, either the transistor T9 or T10 is turned on in response to the X address signal Xn or $\overline{Xn}$. Consequently, the sense amplifier decoder 61 passes the activating signal $\phi 3$ in response to the signal Xn and outputs either the decoded activating signal $\phi 3a$ or $\phi 3b$.

In the refresh operation, a high level refresh control signal $\phi 4$ is applied to turn on the transistors T10, T11 and T13. Two output lines 3a and 3b are equalized by the transistor 13 whereby the offset of the timing for activating the sense amplifiers 41a and 41b can be prevented. Therefore, the sense amplifier decoder 61 passes the activating signal $\phi 3$ irrespective of the value of the signal Xn, and the signals $\phi 3a$ and $\phi 3b$ having the same value are simultaneously outputted.

Referring to FIG. 5, in the sense amplifier decoder 62 the transistors T10 and T11, which were shown in FIG. 4, are removed. The transistor T9 has the gate connected to receive the X address signal Xn and the refresh control signal $\phi 4$, and the transistor T12 has the gate connected to receive the signal $\overline{Xn}$ and the signal $\phi 4$. The operation is carried out in the similar manner as the sense amplifier decoder 61 shown in FIG. 4.

As described above, in the reading operation, the sense amplifiers 41a and 41b are activated for each of the divided memory array blocks, so that even if the storage capacitance of the DRAM is increased, the sensitivity is superior. Therefore, correct reading operation can be carried out with small power consumption.

FIGS. 6(a) and (b) are schematic diagrams showing the conventional sense amplifiers 41a and 41b. Referring to FIG. 6(a), the sense amplifier 41a comprises a number of CMOS flip flops connected between corresponding bit lines $BL_1$ to $BL_K$ and $\overline{BL_1}$ to $\overline{BL_K}$. For example, the CMOS flip flop connected between the bit lines $BL_1$ and $\overline{BL_1}$ comprises PMOS transistors Q3 and Q4 and NMOS transistors Q1 and Q2. As is apparent from the figure, the sense amplifier 41a comprises a number of CMOS flip flops which are activated by the activating signals $\phi 3a$ and $\phi 3a$. Meanwhile, the sense amplifier 41b of FIG. 6(b) also comprises a number of CMOS flip flops which are activated by the signals $\phi 3b$ and $\phi 3b$.

FIG. 7 is a timing chart showing the relation between the change of the current ISa consumed by the activation of two sense amplifiers 41a and 41b in the refresh operation and the activating signals $\phi 3a$, $\phi 3a$, $\phi 3b$ and $\phi 3b$. As described above, in the refresh operation, two sense amplifiers 41a and 41b are simultaneously activated and the data signals stored in the memory cells are amplified. Consequently, a sense amplifier consumption current Isa with a large peak value $I_1$ is consumed, causing the following problems. Namely, since a large current Isa is consumed in a short period of time in the DRAM, the voltage of the power supply Vcc drops. By the decrease of the power supply voltage, the sensitivity of the sense amplifiers 41a and 41b is degraded and malfunctions of other circuits in the DRAM are caused. In addition, it becomes difficult to design the memory board, on which the DRAM is applied, to avoid these problems.

An example of the prior art of particular interest to the present invention is disclosed in Digest of Technical Papers pp. 232–233 of the International Solid-State circuits Conference (ISSCC 83). In this example, a memory cell array in a DRAM is divided into 8 blocks and 4 blocks thereof are selectively activated.

Another example of the prior art of interest to the present invention is disclosed in Digest of Technical Papers pp. 96–97 of International Solid-State Circuits Conference (ISSCC 84). This article shows a circuit for shifting precharge timing of every matrix in the DRAM.

SUMMARY OF THE INVENTION

One object of the present invention is to reduce a peak value of a current consumed in the DRAM in the refresh operation.

Another object of the present invention is to reduce a peak value of a current consumed by sense amplifiers in the DRAM in the refresh operation.

A further object of the present invention is to minimize degradation of sensitivity of sense amplifiers in the DRAM in the refresh operation.

A still further object of the present invention is to prevent malfunctions of other circuits in the DRAM in the refresh operation.

A still further object of the present invention is to facilitate designing of the memory board which includes the DRAM.

Briefly stated, the present invention comprises a plurality of memory array blocks each comprising a memory array having memory cells and a sense amplifier for amplifying data signals stored in the memory cells; a circuit for detecting external designation of refresh mode; a circuit for outputting an activating signal for activating the sense amplifier; and a circuit for applying at least first and second timing controlled activating signals which are displaced in time to the sense amplifiers in response to the activating signal in the refresh mode.

In operation, when the designation of the refresh mode is detected, generated are at least first and second timing controlled activating signals which are displaced in time from each other. At least one of the plurality of memory arrays is activated in response to the first timing controlled activating signal and at least another one is activated in response to the second signal. Since the timing of activation of these sense amplifiers are different from each other, the peak value of the current consumed by the activation of the sense amplifiers can be reduced.

BRIEF DESCRIPTION OF THE DRAWINGS

FIGS. 6(a) and 6(b) are schematic diagrams showing an example of two sense amplifiers shown in FIG. 1;

FIG. 7 is a timing chart showing the relation between the activating signals and the current consumed by the activation of the sense amplifiers shown in FIG. 1;

FIG. 10 is a timing chart showing the relation between the activating signals outputted from the sense amplifier decoder shown in FIG. 8 and the current consumed by the activation of the sense amplifiers.

DESCRIPTION OF THE PREFERRED EMBODIMENTS

Figure 1:
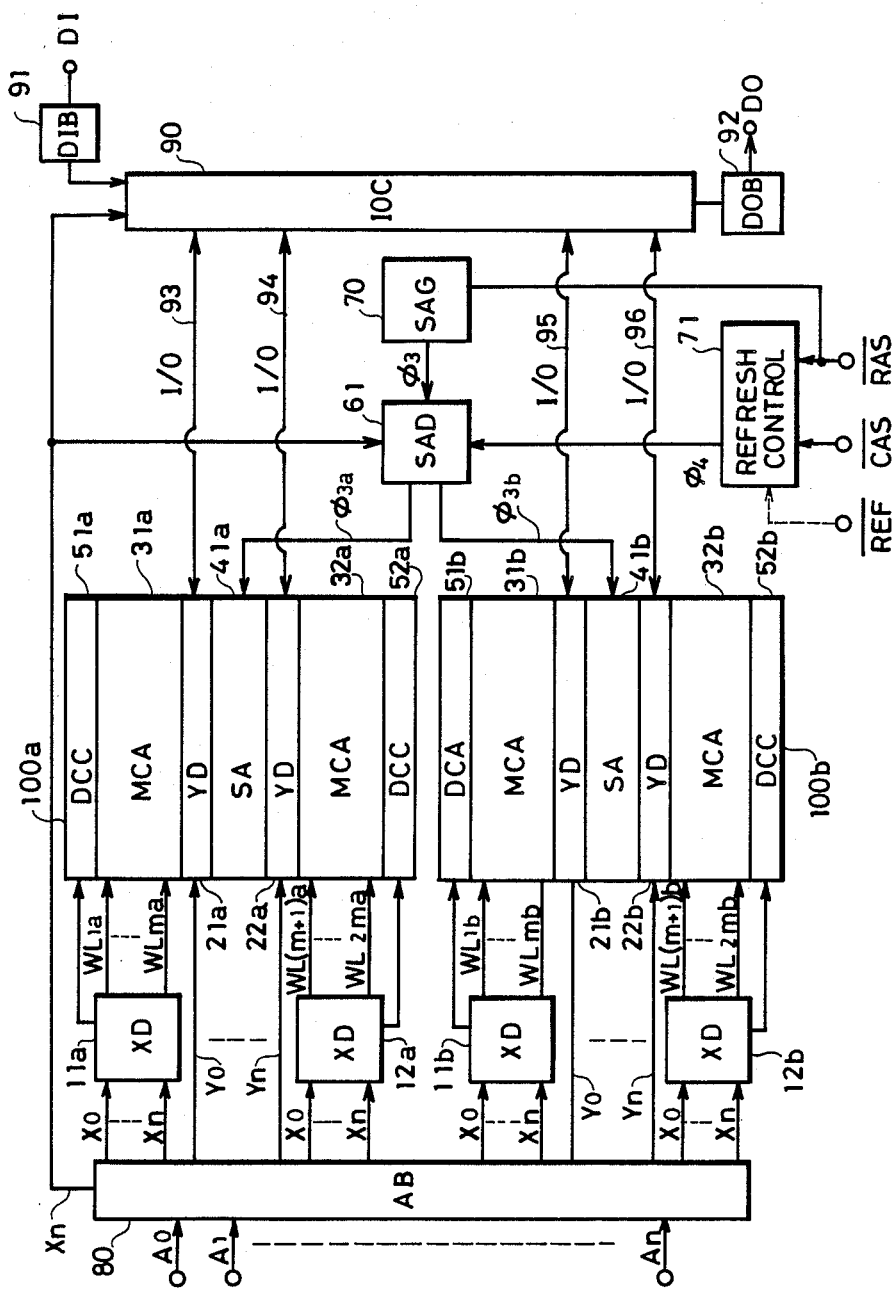
FIG. 1 is a block diagram showing an example of a conventional DRAM.
Figure 2:
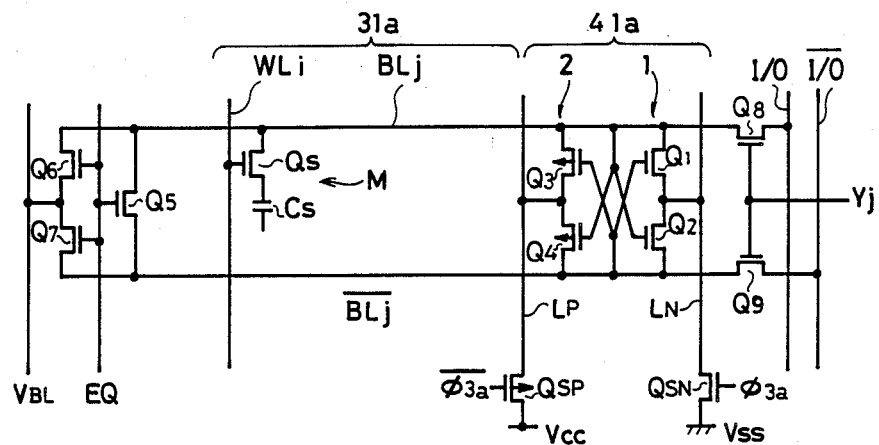
FIG. 2 is a schematic diagram showing a memory cell array, a sense amplifier and peripheral circuits thereof in a conventional DRAM.
Figure 3:
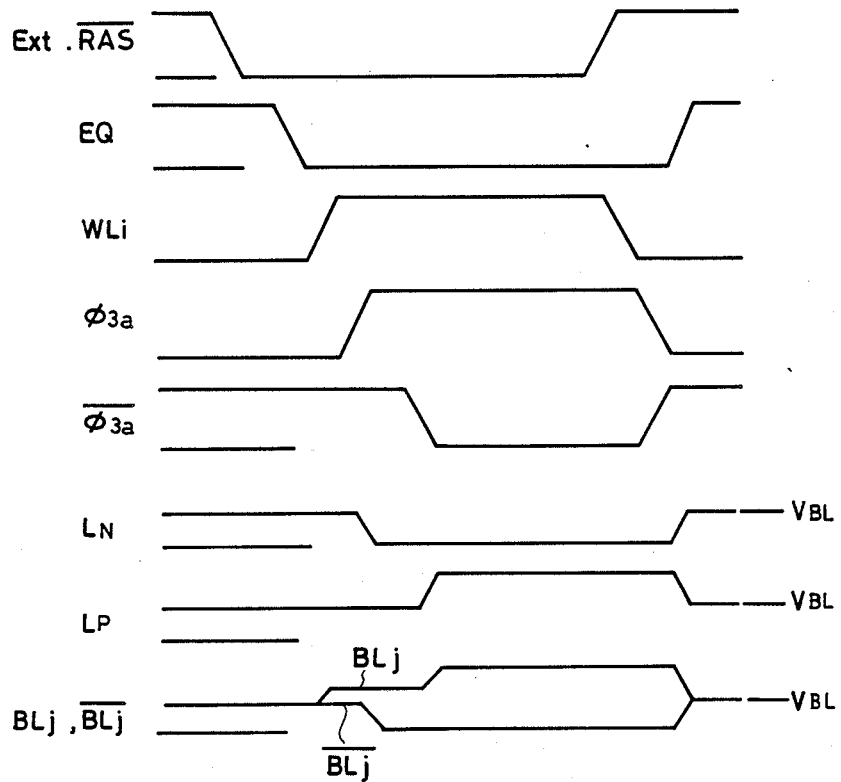
FIG. 3 is a timing chart illustrating the operation of the circuit shown in FIG. 2.
Figure 4:
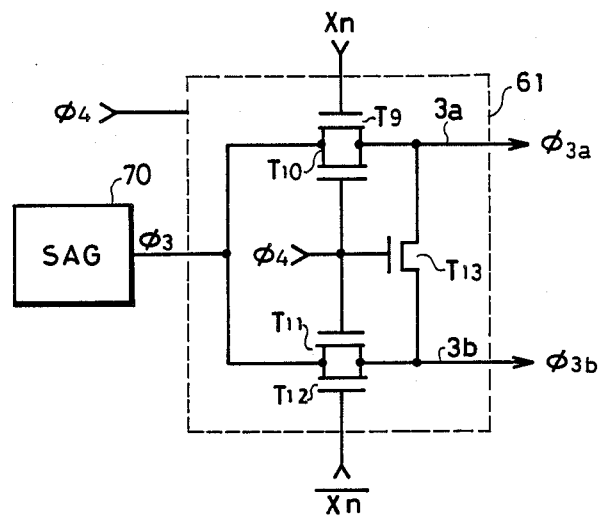
FIGS. 4 and 5 are schematic diagrams showing examples of the sense amplifier decoder shown in FIG. 1.
Figure 5:
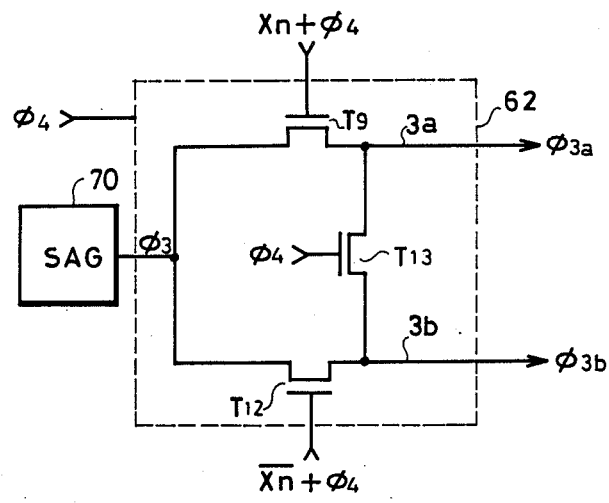
Figure 8:
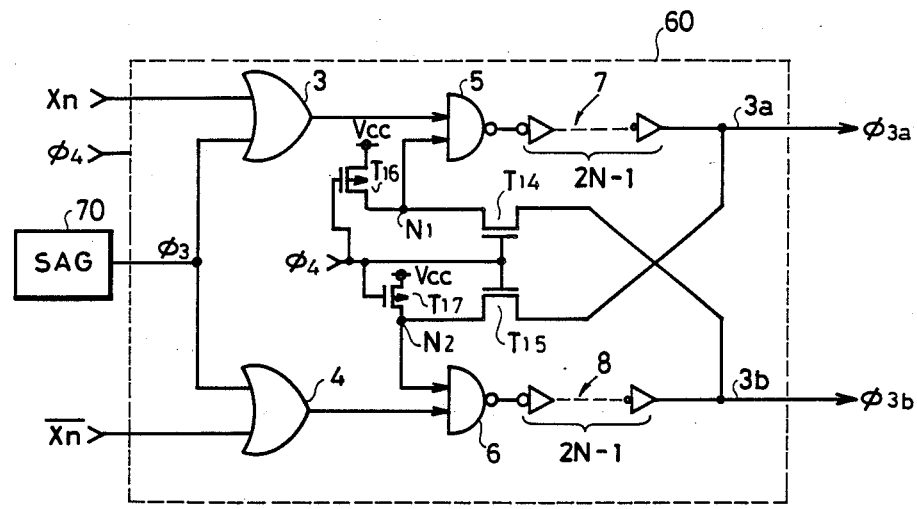
FIG. 8 is a schematic diagram of a sense amplifier decoder showing one embodiment of the present invention.

FIG. 8 is a schematic diagram showing a sense amplifier decoder 60 of one embodiment of the present invention. Referring to FIG. 8, the sense amplifier decoder 60 comprises: OR gates 3 and 4 each having one input connected to receive a signal $\phi 3$ from a sense amplifier activating signal generating circuit (SAG) 70; an NAND gate 5 having one input connected to an output of the OR gate 3; an NAND gate 6 having one input connected to an output of the OR gate 4; a series connection (delay circuit) 7 of an odd number (2N−1) of inverters connected to an output of the NAND gate 5; and a series connection (delay circuit) 8 of an odd number (2N−1) of inverters connected to an output of the NAND gate 6. The signal $\phi 3$ outputted from the circuit 70 becomes low level when it activates the sense amplifier (low active). The OR gate 3 has the other input connected to receive an X address signal Xn and the OR gate 4 has the other input connected to receive the inverted X address signal $\overline{Xn}$.

In addition, the sense amplifier decoder 60 comprises two PMOS transistors T16 and T17 and NMOS transistors T14 and T15. The transistors T14, T15, T16 and T17 have their gates connected together to receive a refresh control signal $\phi 4$ from a refresh control circuit 71. The signal $\phi 4$ changes to the high level when the refresh operation is requested. The transistors T16 and T14 are connected in series between the power supply Vcc and an output line 3b. The node N1 thereof is connected to the other input of the NAND gate 5. The transistors T17 and T15 are connected in series between the power supply Vcc and an output line 3a. The node N2 thereof is connected to the other input of the NAND gate 6.

Figure 9:
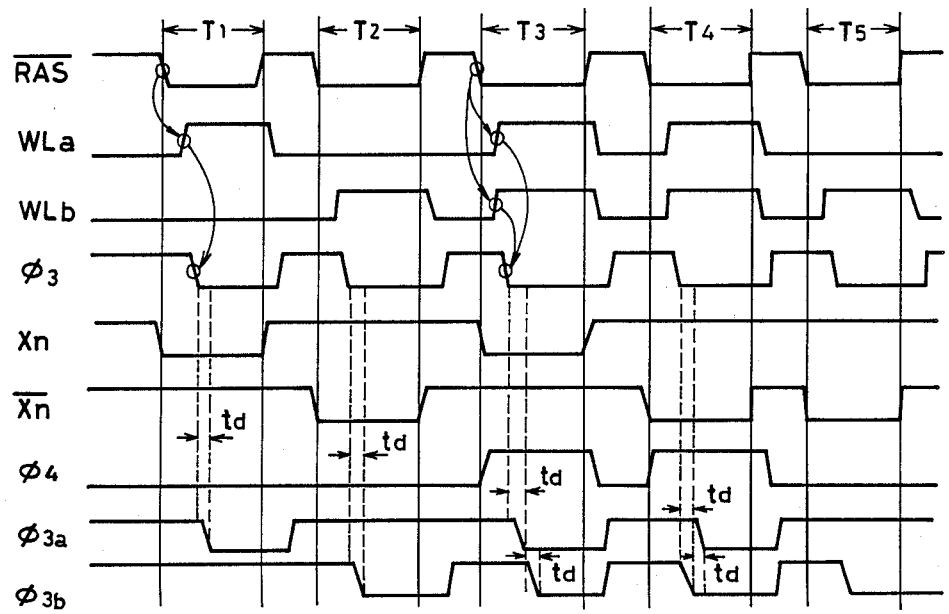
FIG. 9 is a timing chart illustrating the operation of the sense amplifier decoder shown in FIG. 8.

FIG. 9 is a timing chart showing changes of respective signals in the periods of reading operation and refresh operation of the sense amplifier decoder 60 shown in FIG. 8. The operation will be described in the following with reference to FIGS. 8 and 9.

In the periods T1 and T2, the reading operation is carried out. In the period T1, the sense amplifier 41a is activated and in the period T2, the sense amplifier 41b is activated. Thereafter, in the periods T3 and T4, the refresh operation is carried out.

First, in the period T1, the refresh control circuit 71 outputs a low level refresh control signal $\phi 4$. In response to the signal $\phi 4$, the transistors T14 and T15 turn off while the transistors T16 and T17 turn on. In response to the fall of the external $\overline{RAS}$ signal, the reading operation of the DRAM is started. A certain word line WLa in the memory array block 100a is selected by the X decoder 11a or 12a, whereby the potential thereof rises. In response to the rise of the potential on the word line WLa, the signal $\phi 3$ falls. On this occasion, since the X address signal Xn is at the low level and the signal $\overline{Xn}$ is at the high level in this example, the OR gate 3 applies a low level signal to the other input of the NAND gate 5 and the OR gate 4 applies a high level signal to the other input of the NAND gate 6. A high level voltage is applied from the power supply Vcc to one input of the NAND gate 5 through the transistor T16, and a high level voltage is applied to one input of the NAND gate 6 through the transistor T17. Consequently, the NAND gate 5 outputs a high level signal to the delay circuit 7 while the NAND gate 6 outputs a low level signal to the delay circuit 8. As a result, a low level decoded activating signal $\phi 3a$ and a high level decoded activating signal $\phi 3b$ are outputted from the circuit 60. The signal $\phi 3a$ falls delayed from the signal $\phi 3$ by the time td by means of the (2N−1) inverters 7.

Next, in the period T2, the signal $\phi 4$ remains at the low level as in the period T1, but a high level X address signal Xn is outputted. Therefore, contrary to the period T1, a high level signal $\phi 3a$ is outputted and a low level signal $\phi 3b$ is outputted. The signal $\phi 3b$ also falls delayed from the signal $\phi 3$ by the time td by means of the inverters 8.

In the period T3, a high level refresh control signal $\phi 4$ is outputted. Therefore, in response to the signal $\phi 4$, the transistors T14 and T15 turn on while the transistors T16 and T17 turn off. In response to the fall of the external $\overline{RAS}$ signal, the refresh operation is started. The word lines WLa and WLb are brought to the high level in respective memory array blocks 100a and 100b. In response to the rise of the potential on the word lines WLa and WLb, the signal $\phi 3$ falls. On this occasion, since the X address signal Xn is at the low level and the signal $\overline{Xn}$ is at the high level in this example, the OR gate 3 applies a low level signal to the other input of the NAND gate 5 while the OR gate 4 applies a high level signal to the other input of the NAND gate 6. Therefore, a signal $\phi 3a$ is outputted from the delay circuit 7 which falls after a delay of td.

Meanwhile, since the transistors T14 and T16 are on, the output signal $\phi 3a$ from the delay circuit 7 is applied to the other input of the NAND gate 6. In response to the delayed signal $\phi 3a$, the output signal of the NAND gate 6 rises, whereby a signal $\phi 3b$ is outputted from the delay circuit 8 which falls delayed further from the signal $\phi 3a$ by the time of td.

Therefore, in the period T3, a signal $\phi 3a$ is outputted from the circuit 60 which falls delayed from the fall of the signal $\phi 3$ by the time of td and thereafter an output signal φ3b is outputted which falls further delayed from the fall of the signal φ3a by the time of td.

In the period T4, the transistors T14 and T15 turn on while the transistors T16 and T17 turn off in response to a high level refresh control signal φ4 as in the period 3. However, the X address signal Xn is at the high level and X̄n is at the low level. As a result, a signal φ3b is outputted which falls delayed from the fall of the signal φ3 by the time of td and, thereafter, a signal φ3a is outputted from the circuit 60 which falls delayed from the fall of the signal φ3b by the time of td.

In the period T5, the signal φ4 changes to the low level and the reading operation similar to that in the period T2 is carried out.

FIG. 10 is a timing chart showing the relation between the change of the current Isa consumed by the activation of the two amplifiers 41a and 41b in the refresh operation and the signals φ3a, φ3a, φ3b and φ3b having different timings outputted from the circuit 60 shown in FIG. 8. The period shown in this figure, that is, the period from the fall of the signal φ3a to the fall of the signal φ3b delayed by the time td corresponds to the period T3 shown in FIG. 9.

Since the sense amplifier 41a is activated earlier in response to the signals φ3a and φ3a, an activating current Isa having the peak value of $I_2$ is consumed. Then, after the time period of td, the sense amplifier 41b is activated in response to the signals φ3b and φ3b, Ia current Isa having the peak value of $I_2$ is consumed. Since the peak value $I_2$ is lower than the peak value $I_1$ shown in FIG. 7, the problems caused by the current Isa having the peak value of $I_1$ can be eliminated.

In the above embodiment, description was given of a DRAM comprising two divided memory array blocks 100a and 100b. However, the present invention can be applied to a DRAM having larger number of memory array blocks by increasing the divisor. In that case, a part of a plurality of memory array blocks is operated in the normal operations except the refresh operation and larger number of memory array blocks are operated in the refresh operation. The activation of the sense amplifiers in the refresh operation is carried out by activating signals having different timings. At the same time, by increasing the number of memory array blocks to be refreshed, the number of refresh cycles can be reduced.

Logic circuits such as OR gates and AND gates can be used instead of the the transistors T14 to T17 in the sense amplifier decoder 60 shown in FIG. 8.

As described above, in the refresh operation, the sense amplifiers 41a and 41b are activated in response to the signals φ3a and φ3b having different timings of change, respectively, whereby the peak value of the current Isa consumed by the activation can be reduced from the value $I_1$ shown in FIG. 7 to $I_2$ shown in FIG. 10. Therefore, the drop of the power supply voltage caused by a large peak current can be prevented and the degradation of the sensitivity of the sense amplifier can be prevented. Malfunctions of other peripheral circuits in the DRAM can also be prevented. Consequently, the design of the memory board having the DRAM becomes easier.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device comprising:
   a plurality of memory array blocks each having a memory cell array with memory cells for storing data signals, and sense amplifier means connected to said memory array for amplifying data signals stored in said memory cells;
   refresh mode detecting means receiving a signal designating refresh mode from outside for detecting designation of the refresh mode;
   sense amplifier activating means responsive to an externally applied signal for controlling states of said memory device for outputting an activating signal for activating the sense amplifier means in said plurality of memory array blocks; and
   timing control means connected to each of said sense amplifier means in said plurality of memory array blocks, for outputting, when designation of the refresh mode is detected, at least first and second timing controlled activating signals which are displaced in time with each other in response to an activating signal from said sense amplifier activating means; wherein
   at least one of said sense amplifier means in said plurality of memory array blocks is activated in response to said first timing controlled activating signal and at least another one is activated in response to said second timing controlled activating signal, and
   data signals stored in said memory cells are amplified by the activated sense amplifier means to be refreshed.

2. A dynamic random access memory device according to claim 1, wherein said timing control means comprises:
   timing determining means for determining the time displacement between said first and second timing controlled activating signals; and
   phase control means connected to receive the activating signal from said sense amplifier activating means, responsive to the timing determined by said timing determining means for controlling said activating signals to have said first and second timing phase.

3. A dynamic random access memory device according to claim 2, wherein said phase control means comprises:
   first and second delay means each connected to receive an activating signal from said sense amplifier activating means;
   first switching means connected to receive signals from said sense amplifier activating means and from an output of said second delay means, responsive to said refresh mode detecting means for applying either said activating signal or the output signal from said second delay means to said first delay means; and
   second switching means connected to receive signals from said sense amplifier activating means and from an output of said first delay means, responsive to said refresh mode detecting means for applying said activating signal or the output signal of said first delay means to said second delay means.

4. A dynamic random access memory device according to claim 3 wherein
   each of said first and second delay means comprises a series connection of an odd number of inverters, said first switching means comprises first NAND gate means, and said second switching means comprises second NAND gate means.

5. A dynamic random access memory device according to claim 2, wherein said timing determining means comprises means for determining the time displacement between said first and second timing controlled activating signals in response to an externally applied X address signal.

6. A dynamic random access memory device according to claim 1, wherein said memory array comprises a bit line pair to which said memory cell is connected, and said sense amplifier means comprises a CMOS flip flop connected to said bit line pair, said CMOS flip flop receiving a power supply in response to an activating signal from said sense amplifier activating means.

7. A dynamic random access memory device according to claim 1, wherein said refresh mode detecting means comprises means for detecting a change of a logic state of an external $\overline{CAS}$ (column address strobe) signal before a change of a logic state of an external $\overline{RAS}$ (row address strobe) signal.

8. A dynamic random access memory device according to claim 1, wherein said refresh mode detecting means comprises means for detecting a signal externally designating a self refresh mode.

9. A dynamic random access memory device according to claim 1, wherein said signal for controlling the state of the memory device comprises an external $\overline{RAS}$ signal.

* * * * *